(12) United States Patent
Ekbote et al.

(10) Patent No.: US 9,202,883 B2
(45) Date of Patent: Dec. 1, 2015

(54) SILICIDE FORMATION DUE TO IMPROVED SIGE FACETING

(71) Applicant: Texas Instruments Incorporated, Dallas, TX (US)

(72) Inventors: Shashank S. Ekbote, Allen, TX (US); Kwan-Yong Lim, Plano, TX (US); Ebenezer Eshun, Plano, TX (US); Youn Sung Choi, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/744,384

(22) Filed: Jun. 19, 2015

(65) Prior Publication Data

US 2015/0287801 A1 Oct. 8, 2015

Related U.S. Application Data

(62) Division of application No. 13/972,973, filed on Aug. 22, 2013, now Pat. No. 9,093,298.

(51) Int. Cl.
*H01L 29/08* (2006.01)
*H01L 29/45* (2006.01)
*H01L 29/161* (2006.01)
*H01L 27/088* (2006.01)
*H01L 27/02* (2006.01)
*H01L 21/336* (2006.01)

(52) U.S. Cl.
CPC .......... *H01L 29/458* (2013.01); *H01L 27/0207* (2013.01); *H01L 27/088* (2013.01); *H01L 29/0847* (2013.01); *H01L 29/161* (2013.01)

(58) Field of Classification Search
CPC ................ H01L 27/088; H01L 29/665; H01L 29/41783
USPC ....................................................... 257/384
See application file for complete search history.

(56) References Cited

U.S. PATENT DOCUMENTS

| | | | |
|---|---|---|---|
| 7,342,273 B2 | 3/2008 | Cho et al. | |
| 8,377,784 B2 | 2/2013 | Cheng et al. | |
| 8,530,316 B2 | 9/2013 | Cheng et al. | |
| 8,735,255 B2 | 5/2014 | Hsiao et al. | |
| 8,835,267 B2 | 9/2014 | Lee et al. | |
| 8,900,960 B2 | 12/2014 | Tsai et al. | |
| 8,927,374 B2 | 1/2015 | Su et al. | |
| 8,946,007 B2 | 2/2015 | Doris et al. | |
| 8,946,060 B2 | 2/2015 | Cheng et al. | |
| 2011/0003450 A1 | 1/2011 | Lee et al. | |
| 2013/0252392 A1 | 9/2013 | Cheng et al. | |
| 2013/0260519 A1 | 10/2013 | Tsai et al. | |
| 2014/0291734 A1 | 10/2014 | Cheng et al. | |
| 2015/0054084 A1 | 2/2015 | Ekbote et al. | |

*Primary Examiner* — Earl Taylor
(74) *Attorney, Agent, or Firm* — Jacqueline J. Garner; Frank D. Cimino

(57) ABSTRACT

An integrated circuit includes a PMOS gate structure and a gate structure on adjacent field oxide. An epitaxy hard mask is formed over the gate structure on the field oxide so that the epitaxy hard mask overlaps the semiconductor material in PMOS source/drain region. SiGe semiconductor material is epitaxially formed in the source/drain regions, so that that a top edge of the SiGe semiconductor material at the field oxide does not extend more than one third of a depth of the SiGe in the source/drain region abutting the field oxide. Dielectric spacers on lateral surfaces of the gate structure on the field oxide extend onto the SiGe; at least one third of the SiGe is exposed. Metal silicide covers at least one third of a top surface of the SiGe. A contact has at least half of a bottom of the contact directly contacts the metal silicide on the SiGe.

8 Claims, 11 Drawing Sheets

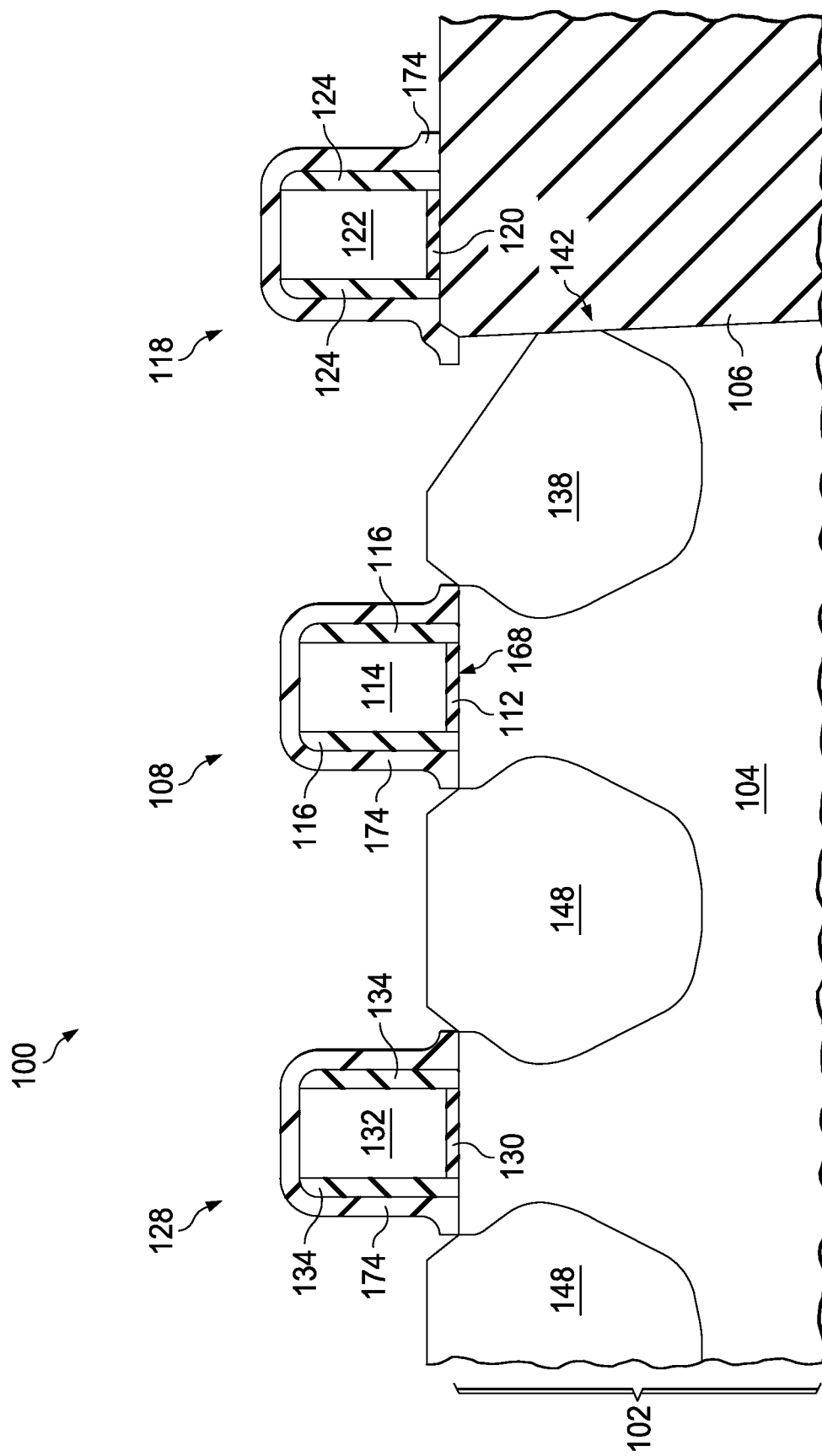

SILICIDE FORMATION DUE TO IMPROVED SIGE FACETING

CROSS REFERENCE TO RELATED APPLICATIONS

This application is a divisional of U.S. Nonprovisional patent application Ser. No. 13/972,973, filed Aug. 22, 2013, the contents of which are herein incorporated by reference in its entirety.

FIELD OF THE INVENTION

This invention relates to the field of integrated circuits. More particularly, this invention relates to MOS transistors in integrated circuits.

BACKGROUND OF THE INVENTION

An integrated circuit may include a p-channel metal oxide semiconductor (PMOS) transistor with silicon-germanium (SiGe) epitaxial source/drain regions. An instance of the SiGe source/drain regions may abut field oxide formed by a shallow trench isolation (STI) process. The SiGe source/drain region may have a highly angled surface facet and a cavity between the silicon germanium epitaxial material and the dielectric material of the field oxide.

A gate structure may be located on the field oxide adjacent to the SiGe source/drain region so that dielectric spacer material on a lateral surface of the gate structure may extend into the cavity and down to the silicon germanium epitaxial material, reducing an area for metal silicide on the SiGe source/drain region. A contact disposed on the SiGe source/drain region may undesirably provide a high resistance connection to the PMOS transistor due to the reduced silicide area and possibly in combination with alignment tolerance of the contact to the source/drain region.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a PMOS transistor abutting field oxide is formed by forming a gate structure for the PMOS transistor and concurrently forming a gate structure on the field oxide adjacent to a source/drain region of the PMOS transistor. An epitaxy hard mask layer is formed over the PMOS transistor and the gate structure on the field oxide, and patterned so that the epitaxy hard mask layer covers a boundary between the field oxide and semiconductor material in the source/drain region and overlaps the semiconductor material. An epitaxy cavity etch removes semiconductor material of a substrate of the integrated circuit in the source/drain regions of the PMOS transistor. Silicon-germanium semiconductor material is epitaxially formed in the source/drain regions, so that a top edge of the boundary between the SiGe semiconductor material and the field oxide does not extend more than one third of a depth of the SiGe semiconductor material in the source/drain region abutting the field oxide. Dielectric spacers are formed on lateral surfaces of the PMOS gate structure and the gate structure on the field oxide, so that at least one third of a top surface of the SiGe in the source/drain region abutting the field oxide is exposed. Metal silicide is formed on the exposed SiGe so that the metal silicide of the SiGe in the source/drain region abutting the field oxide covers at least one third of a top surface of the SiGe. A contact is formed so that at least half of a bottom of the contact directly contacts the metal silicide on the SiGe in the source/drain region abutting the field oxide.

DESCRIPTION OF THE VIEWS OF THE DRAWING

FIG. 2A through FIG. 2G are cross sections of the integrated circuit of FIG. 1, depicted in successive stages of an exemplary fabrication sequence.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing a PMOS transistor abutting field oxide is formed by forming a gate structure for the PMOS transistor and concurrently forming a gate structure on the field oxide adjacent to a source/drain region of the PMOS transistor. An epitaxy hard mask layer is formed over the PMOS transistor and the gate structure on the field oxide, and patterned so that the epitaxy hard mask layer covers a boundary between the field oxide and semiconductor material in the source/drain region and overlaps the semiconductor material. An epitaxy cavity etch removes semiconductor material of a substrate of the integrated circuit in the source/drain regions of the PMOS transistor. Silicon-germanium semiconductor material is epitaxially formed in the source/drain regions, so that a top edge of a boundary between the SiGe semiconductor material and the field oxide does not extend more than one third of a depth of the SiGe semiconductor material in the source/drain region abutting the field oxide. Dielectric spacers are formed on lateral surfaces of the PMOS gate structure and the gate structure on the field oxide, so that at least one third of a top surface of the SiGe in the source/drain region abutting the field oxide is exposed. Metal silicide is formed on the exposed SiGe so that the metal silicide of the SiGe in the source/drain region abutting the field oxide covers at least one third of a top surface of the SiGe. A contact is formed so that at least half of a bottom of the contact directly contacts the metal silicide on the SiGe in the source/drain region abutting the field oxide.

Figure 1:
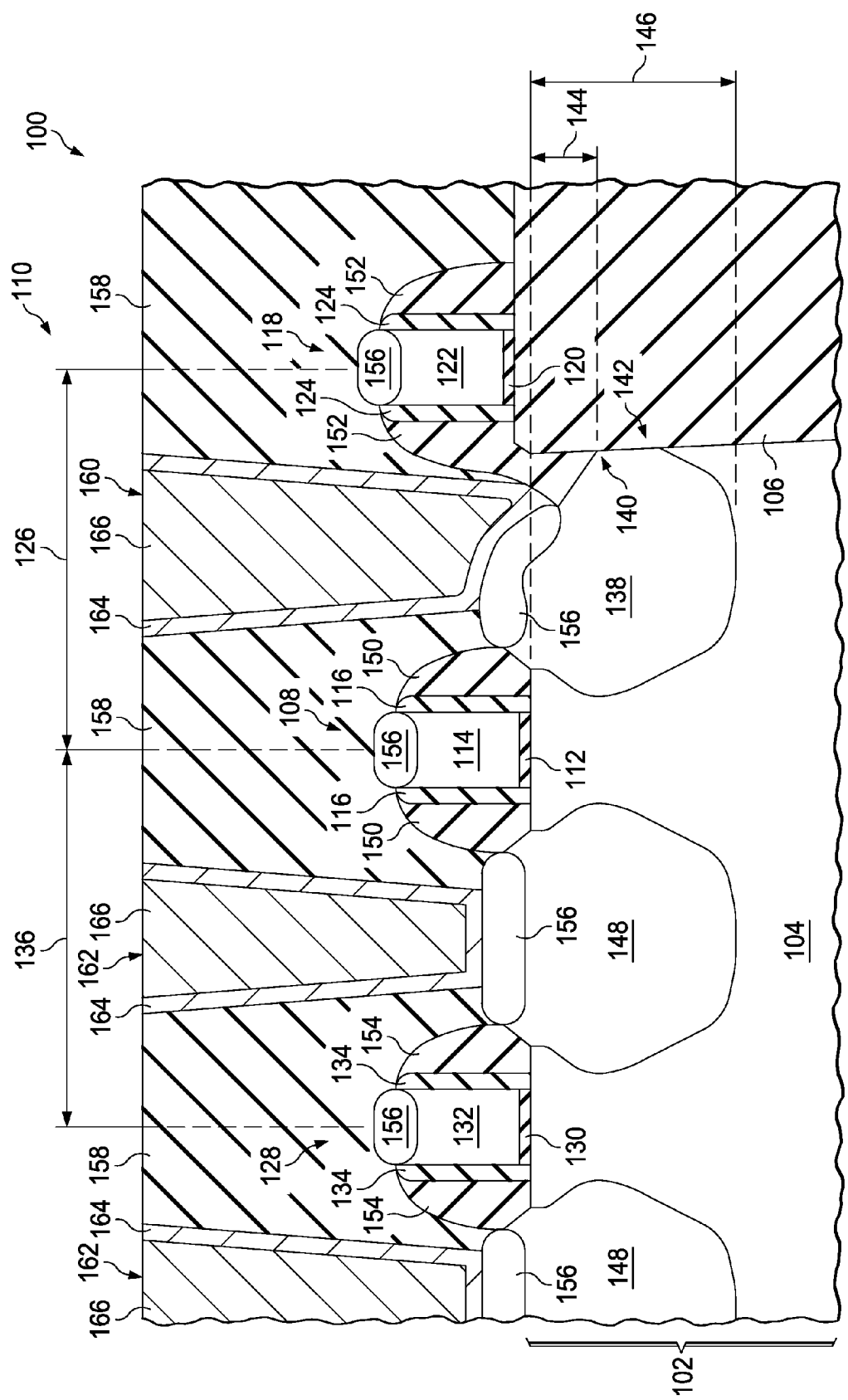
FIG. 1 is a cross section of an exemplary integrated circuit containing a PMOS transistor adjacent to field oxide.

FIG. 1 is a cross section of an exemplary integrated circuit containing a PMOS transistor adjacent to field oxide. The integrated circuit 100 is formed in and on a substrate 102 which includes semiconductor material 104 at its top surface. Field oxide 106 is disposed in the substrate 102, so that a top surface of the field oxide 106 is substantially coplanar, within 15 nanometers, of the top surface 168 of the substrate 102.

A first gate structure 108 for a PMOS transistor 110 is disposed on the substrate 102 proximate to the field oxide 106. The first gate structure 108 includes a gate dielectric layer 112 disposed on the semiconductor material 104 at the top surface 168 of the substrate 102. The gate dielectric layer 112 may be, for example, a thermally grown layer of silicon dioxide or a deposited layer of dielectric material such as hafnium oxide or zirconium oxide. The first gate structure also includes a gate 114 over the gate dielectric layer 112. The gate 114 may be, for example, primarily polycrystalline silicon. The first gate structure further includes first dielectric spacers 116 disposed on lateral surfaces of the gate 114. The first dielectric spacers 116 may include, for example, one or more layers of silicon dioxide and silicon nitride.

A second gate structure 118 is disposed on the field oxide 106 adjacent to the semiconductor material 104. The second gate structure 118 may possibly have a gate dielectric layer 120, if for example, the gate dielectric layers 112 and 120 are deposited dielectric layers which are concurrently deposited on the semiconductor material 104 and the field oxide 106. If the gate dielectric layer 112 of the first gate structure 108 is, for example, a thermally grown oxide layer which does not form on the field oxide 106, the second gate structure 118 may be free of a gate dielectric layer. The second gate structure 118 includes a gate 122 on the gate dielectric layer 120 if present, or on the field oxide 106 if the second gate structure 118 is free of a gate dielectric layer. The gate 122 does not overlap a sidewall 142 of the field oxide 106. The second gate structure 118 includes first dielectric spacers 124 disposed on lateral surfaces of the gate 122.

The second gate structure 118 may be, for example a connection between gates of a logic component such as an inverter, NAND gate or NOR gate. The second gate structure 118 may alternatively be electrically inactive and formed to provide uniform patterning for the first gate structure 108. A lateral distance 126 from a center of the first gate structure 108 to a center of the second gate structure 118 may be, for example, a minimum distance for contacted gate structures according to design rules used to fabricate the integrated circuit 100. The lateral distance 126 may be, for example, less than 150 nanometers.

An optional third gate structure 128 may be disposed adjacent to the first gate structure 108 opposite from the second gate structure 118. The third gate structure 128 may be disposed on the semiconductor material 104 as depicted in FIG. 1 or may be disposed on field oxide. The third gate structure 128 includes a gate dielectric layer 130, possibly with the exception discussed in reference to the gate dielectric layer 120 of the second gate structure 118. The third gate structure 128 includes a gate 132 on the gate dielectric layer 130 if present, and first dielectric spacers 134 disposed on lateral surfaces of the gate 132. The third gate structure 128 may be part of the PMOS transistor 110, may be part of a different PMOS transistor, or may be electrically inactive and formed to provide uniform patterning for the first gate structure 108.

A lateral distance 136 from the center of the first gate structure 108 to a center of the third gate structure 128 may be, for example, substantially equal to the lateral distance 126 from the center of the first gate structure 108 to the center of the second gate structure 118. The lateral distance 136 may also be less than 150 nanometers.

A first SiGe source/drain region 138 is disposed in the substrate 102 on the semiconductor material 104 between the first gate structure 108 and the field oxide 106. A top edge 140 of the first SiGe source/drain region 138 at the sidewall 142 of the field oxide 106 may be disposed below a plane of the top surface 168 of the semiconductor material 104 under the first gate structure 108. A vertical distance 144 of the top edge 140 of the first SiGe source/drain region 138 at the sidewall 142 of the field oxide 106 is less than one-third of a depth 146 of the first SiGe source/drain region 138 below the top surface 168 of the semiconductor material 104. The depth 146 of the first SiGe source/drain region 138 may be 50 nanometers to 80 nanometers. Additional SiGe source/drain regions 148 are disposed in the substrate 102 on the semiconductor material 104, between the first gate structure 108 and the third gate structure 128 and possibly adjacent to the third gate structure 128 opposite from the first gate structure 108.

Second dielectric spacers 150 are disposed on the first dielectric spacers 116 of the first gate structure 108, extending onto the first SiGe source/drain region 138 and the SiGe source/drain region 148 adjacent to the first gate structure 108. The second dielectric spacers 150 may include one or more layers of silicon nitride and/or silicon dioxide, and may have a maximum lateral thickness of, for example, one-third to two-thirds of a width of the gate 114 of the first gate structure 108. The width of the gate 114 is sometimes referred to as the gate length of the gate 114. Second dielectric spacers 152 are also disposed on the first dielectric spacers 124 of the second gate structure 118 and extend onto the first SiGe source/drain region 138. Second dielectric spacers 154 are also disposed on the first dielectric spacers 134 of the third gate structure 128 and extend onto the SiGe source/drain regions 148 adjacent to the third gate structure 128.

Metal silicide 156 is disposed on the first SiGe source/drain region 138 and the additional SiGe source/drain regions 148 in areas which are exposed by the second dielectric spacers 150, 152 and 154. The metal silicide 156 covers at least a third of a top surface of the first SiGe source/drain region 138. The metal silicide 156 may also be disposed at tops of the gates 114, 122 and 132.

A pre-metal dielectric (PMD) layer 158 is disposed over an existing top surface of the integrated circuit 100. The PMD layer 158 may include several layers of dielectric material, including, for example, a liner of silicon nitride, a main layer of boron-phosphorus-silicate glass (BPSG) and possibly a cap layer of silicon nitride, silicon carbide, or silicon carbide nitride.

A contact 160 is disposed in the PMD layer 158, making electrical connections to the top surface of the first SiGe source/drain region 138. At least half of a bottom of the contact 160 directly contacts the first SiGe source/drain region 138. The bottom of the contact 160 may be, for example, less than 40 nanometers wide. Additional contacts 162 may be disposed in the PMD layer 158 making electrical connections to the additional SiGe source/drain regions 148. The contacts 160 and 162 may include a liner 164 of titanium and titanium nitride and a fill metal 166 of tungsten.

Figure 2A:
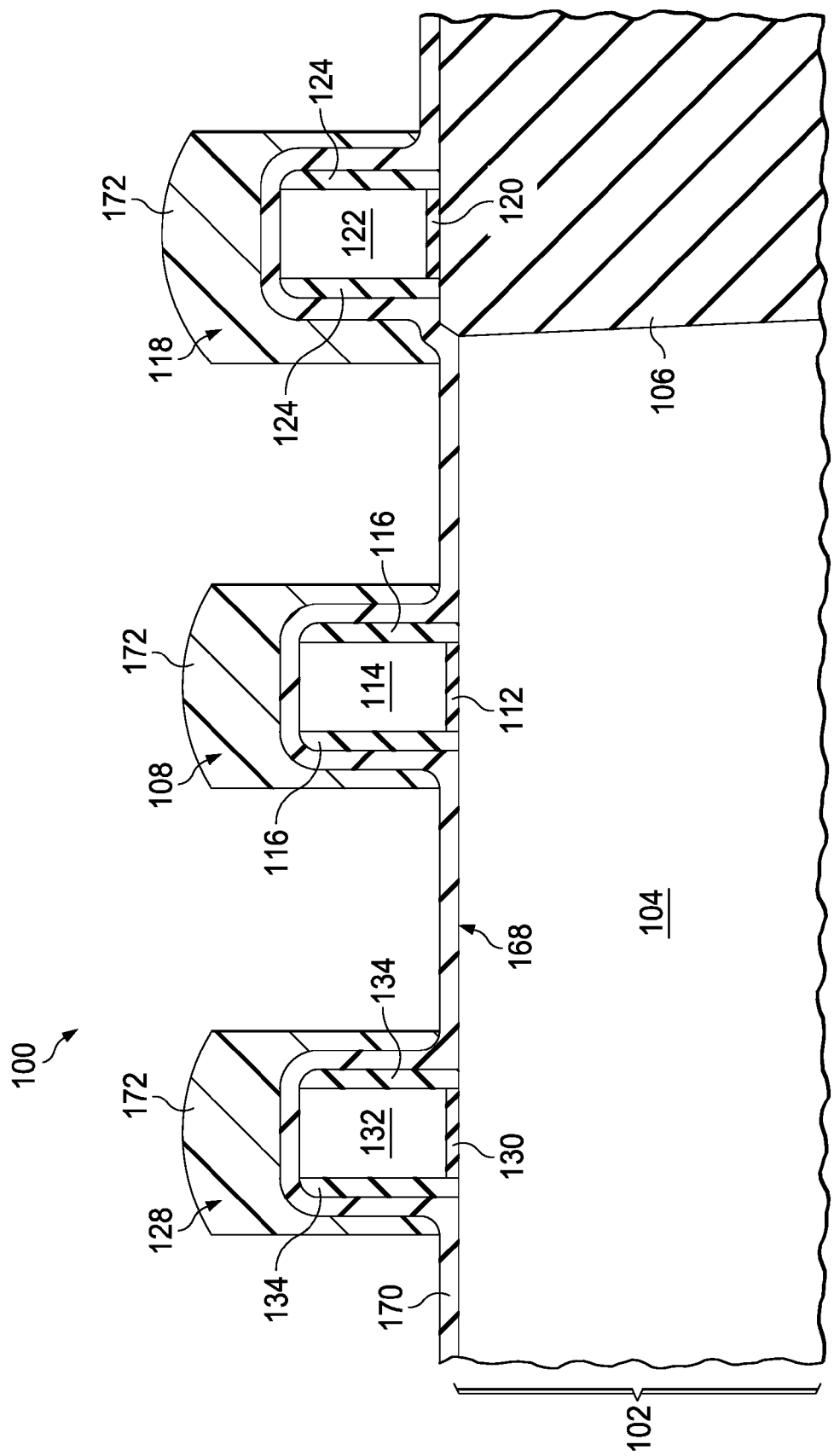

FIG. 2A through FIG. 2G are cross sections of the integrated circuit of FIG. 1, depicted in successive stages of an exemplary fabrication sequence. Referring to FIG. 2A, formation of the integrated circuit 100 starts with the substrate 102. The substrate 102 may be, for example, a single-crystal silicon wafer, a silicon-on-insulator (SOI) wafer, a hybrid orientation technology (HOT) wafer with regions of semiconductor at the top surface having different crystal orientation, or other substrate appropriate for forming the integrated circuit 100. The substrate 102 includes the semiconductor material 104 which extends to the top surface 168 of the substrate 102. The semiconductor material 104 may be, for example, single crystal silicon.

The field oxide 106 is formed in the substrate 102. The field oxide 106 may be formed by a shallow trench isolation (STI) process, which includes etching a trench in the substrate 102, filling the trench with dielectric material such as silicon dioxide, and removing the dielectric material from over the top surface 168 of the substrate 102 with a chemical mechanical polish (CMP) process. The top surface of the field oxide 106 is substantially coplanar, within 15 nanometers, of the top surface 168 of the substrate 102.

The gate dielectric layer 112 of the first gate structure 108 and the gate dielectric layer 130 of the third gate structure 128, and possibly the gate dielectric layer 120 of the second gate structure 118 are formed at the top surface 168 of the semiconductor material 104. In one version of the instant example, the gate dielectric layers 112 and 130 may be formed by thermal oxidation of the semiconductor material 104; in this version, no gate dielectric layer is formed on the field oxide 106 and thus the second gate structure is free of a gate dielectric layer. In another version of the instant embodiment, the gate dielectric layers 112, 130 and 120 may be formed by deposition of dielectric material on the top surface 168 of the semiconductor material 104 and the top surface of the field oxide 106. The deposited gate dielectric layers 112, 130 and 120 may include, for example, high-k dielectric materials such as hafnium oxide, zirconium oxide and/or tantalum oxide.

Subsequently, the gate 114 of the first gate structure 108, the gate 122 of the second gate structure 118 and the gate 132 of the third gate structure 128 are formed on the gate dielectric layers 112, 120 if present, and 130, respectively. The gates 114, 122 and 132 may be formed, for example, by forming a layer of polycrystalline silicon, commonly referred to as polysilicon, over the gate dielectric layers 112, 120 and 130, and forming a layer of hard mask material such as amorphous carbon over the layer of polysilicon. A photoresist etch mask is formed over the layer of hard mask material to cover areas for the gates 114, 122 and 132. A first reactive ion etch (RIE) process removes exposed hard mask material to form a hard etch mask over the polysilicon layer. A second RIE process removes exposed polysilicon to form the gates 114, 122 and 132, and erodes any remaining photoresist. The remaining hard mask material is subsequently removed, for example by ashing.

The first dielectric spacers 116 of the first gate structure 108, the first dielectric spacers 124 of the second gate structure 118, and the first dielectric spacers 134 of the third gate structure 128 are formed on lateral surfaces of the gates 114, 122 and 132, respectively. The first dielectric spacers 116, 124 and 134 may be formed by thermally oxidizing the lateral surfaces of the gates 114, 122 and 132 to form a layer of silicon dioxide. One or more conformal layers of silicon dioxide and/or silicon nitride may be subsequently formed over the gates 114, 122 and 132 by plasma enhanced chemical vapor deposition (PECVD) and/or low pressure chemical vapor deposition (LPCVD) processes. A subsequent anisotropic plasma etch removes the layers of silicon dioxide and silicon nitride from tops of the gates 114, 122 and 132 to form the first dielectric spacers 116, 124 and 134.

An epitaxy hard mask layer 170 is formed over an existing top surface of the integrated circuit 100. The epitaxy hard mask layer 170 may include, for example, 20 nanometers to 50 nanometers of silicon nitride formed by an LPCVD process.

An epitaxy mask 172 is formed over the first gate structure 108, the second gate structure 118 and the third gate structure 128, exposing portions of the epitaxy hard mask layer 170 in contact with the semiconductor material 104 and the field oxide 106. The epitaxy mask 172 may include photoresist, and may be formed by a photolithographic process using a similar illumination source as that used to form the photoresist etch mask for the gates 114, 122 and 132. The epitaxy mask 172 is formed over the second gate structure 118 so as to overlap a portion of the top surface 168 of the semiconductor material 104 adjacent to the field oxide 106 between the first gate structure 108 and the second gate structure 118 and expose a portion of the epitaxy hard mask layer 170 between the first gate structure 108 and the second gate structure 118. The epitaxy mask 172 may possibly extend farther past the first dielectric spacers 124 of the second gate structure 118 than past the first dielectric spacers 116 of the first gate structure 108, so as to overlap a portion of the top surface 168 of the semiconductor material 104. In an alternate version of the instant example, the epitaxy mask 172 may possibly not be formed over the first gate structure 108 or the third gate structure 128.

Figure 2B:
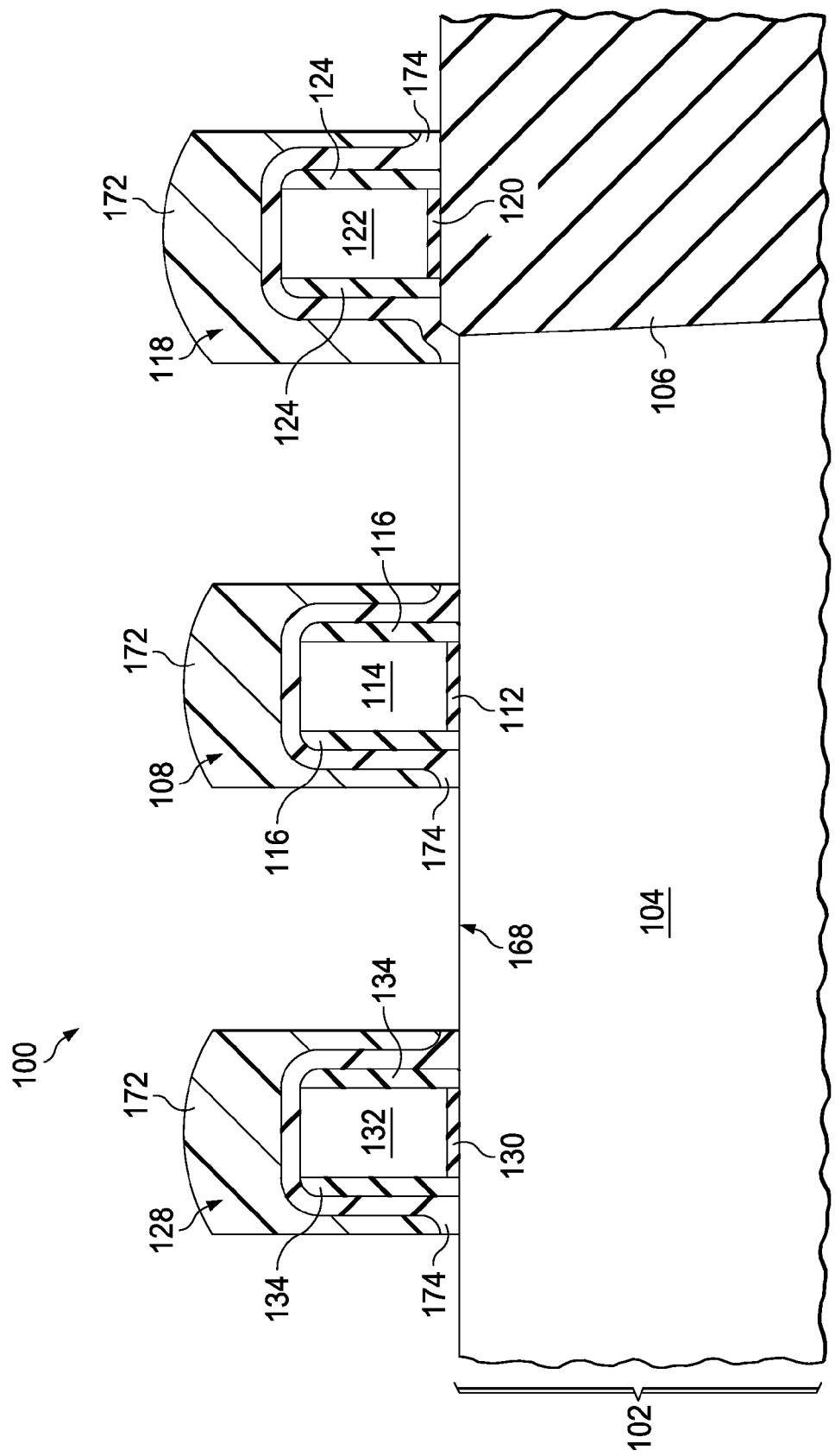

Referring to FIG. 2B, an etch process removes the epitaxy hard mask layer 170 of FIG. 2A that is exposed by the epitaxy mask 172 to form an epitaxy hard mask 174 over the first gate structure 108, the second gate structure 118 and the third gate structure 128. The epitaxy hard mask 174 over the second gate structure 118 overlaps the top surface 168 of the semiconductor material 104 adjacent to the field oxide 106 between the first gate structure 108 and the second gate structure 118. As noted in reference to FIG. 2A, in an alternate version of the instant example, the first gate structure 108 and the third gate structure 128 may be free of the epitaxy mask 172 and hence be free of the epitaxy hard mask 174. The epitaxy mask 172 is removed after the etch process to form the epitaxy hard mask 174 is completed.

Figure 2C:
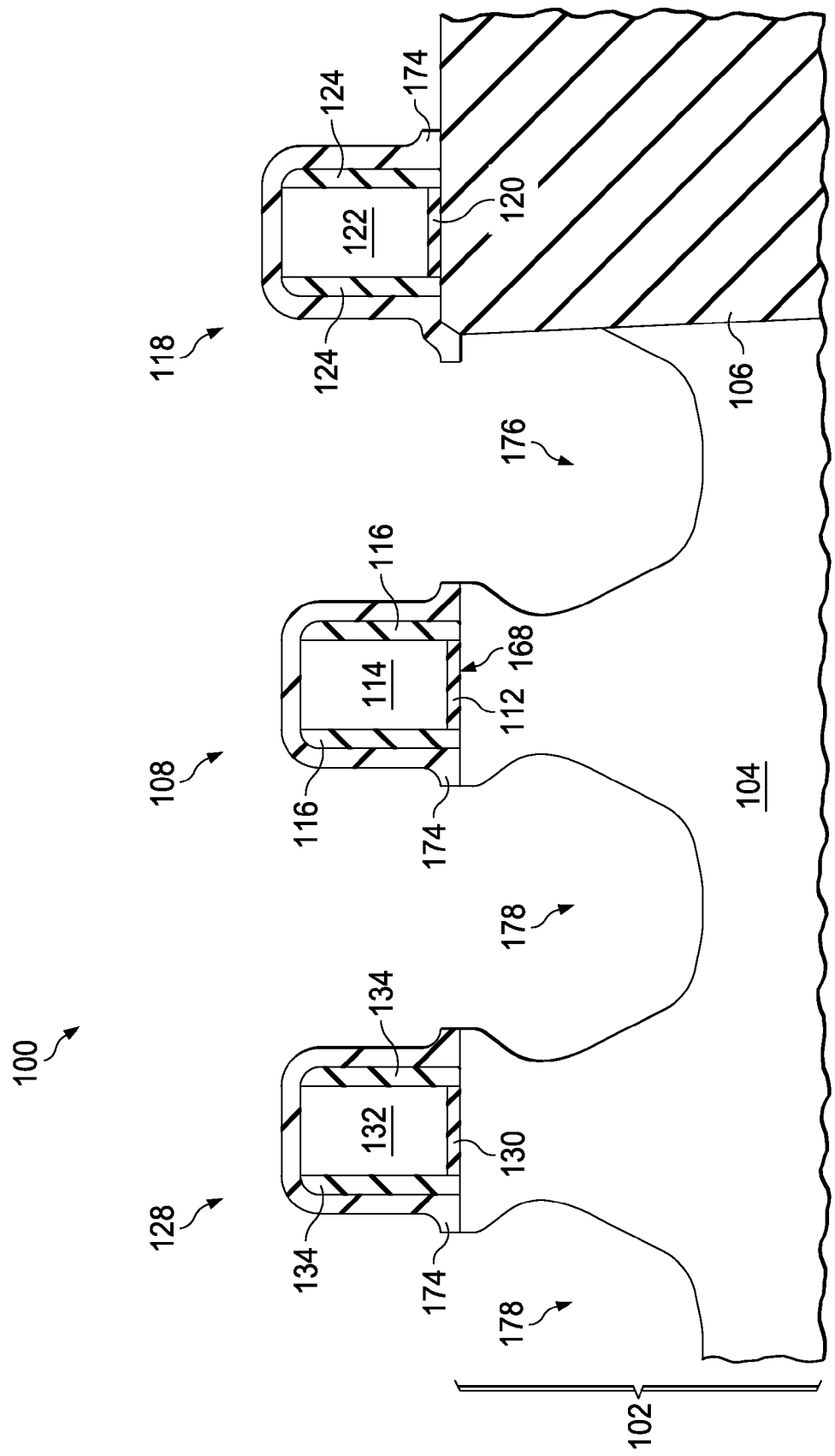

Referring to FIG. 2C, an etch process removes the semiconductor material 104 from source/drain regions exposed by the epitaxy hard mask 174 to form a first source/drain cavity 176 between the first gate structure 108 and the second gate structure 118, and to form additional source/drain cavities 178 adjacent to the first gate structure 108 and the third gate structure 128. The first source/drain cavity 176 and the additional source/drain cavities 178 may be, for example, 50 nanometers to 80 nanometers deep below the top surface 168 of the semiconductor material 104. Forming the epitaxy hard mask 174 overlapping the semiconductor material 104 as described in reference to FIG. 2B advantageously results in the semiconductor material 104 extending along the field oxide 106 from a bottom of the first source/drain cavity 176, which provides the desirable SiGe profile depicted in FIG. 1.

Referring to FIG. 2D, SiGe semiconductor material is epitaxially formed in the first source/drain cavity 176 and the additional source/drain cavities 178 to form the first SiGe source/drain region 138 and the additional SiGe source/drain regions 148, respectively. A top surface facet of the first SiGe source/drain region 138 may be slanted due to limited growth of the SiGe semiconductor material on the sidewall 142 of the field oxide 106. The epitaxy hard mask 174 is removed after the etch process to form the first source/drain cavity 176 and the additional source/drain cavities 178 is completed, for example by a plasma etch process or a wet etch process using phosphoric acid.

Figure 2E:
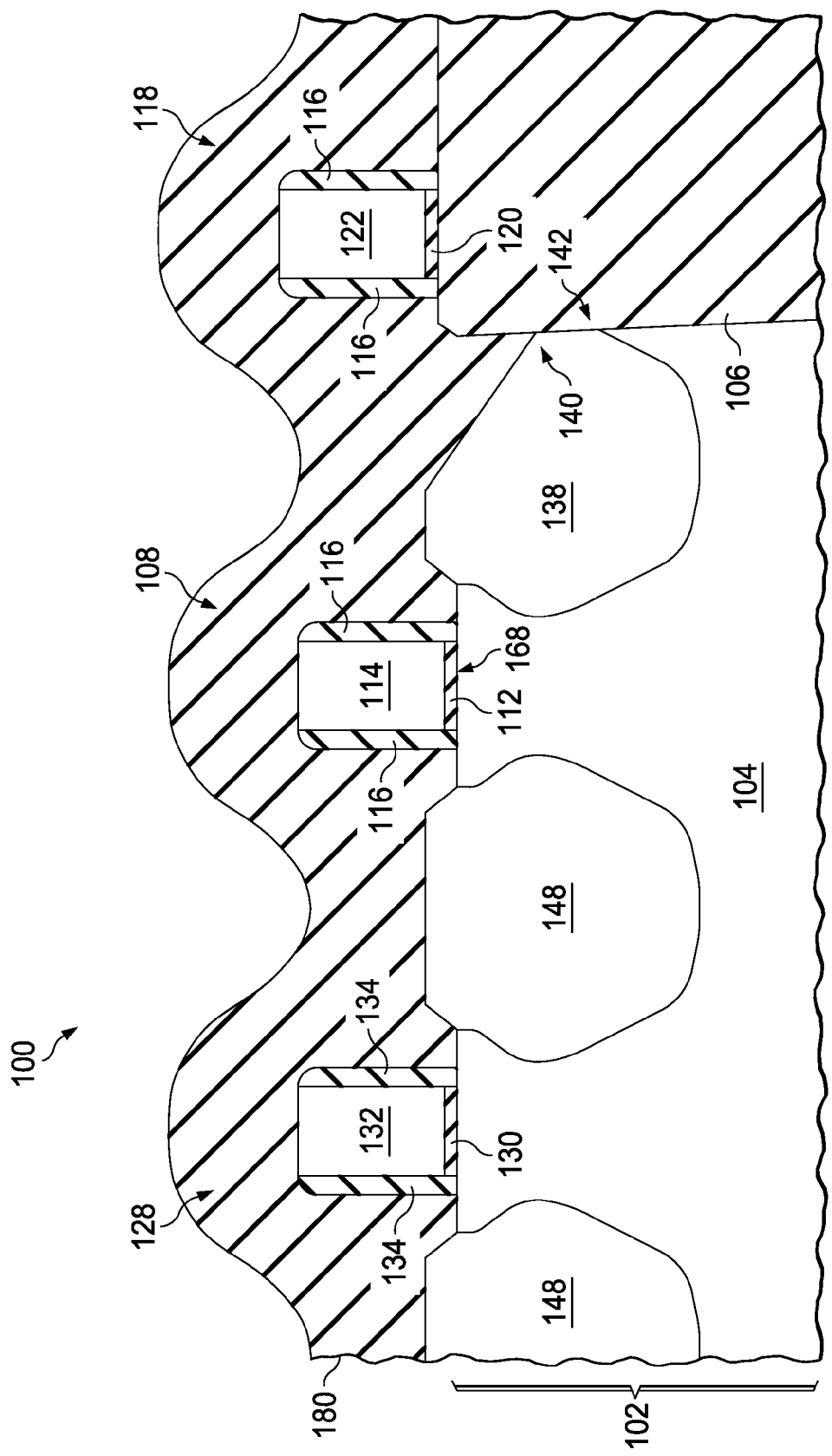

Referring to FIG. 2E, a conformal layer of dielectric spacer material 180 is formed over an existing top surface of the integrated circuit 100. The conformal layer of dielectric spacer material 180 may include one or more layers of silicon nitride and/or silicon dioxide, and have a total thickness of one-third to two-thirds of a width of the gates 114, 122 and 132. The conformal layer of dielectric spacer material 180 may be significantly thicker over the top edge 140 of the first SiGe source/drain region 138 at the sidewall 142 of the field oxide 106.

Figure 2F:
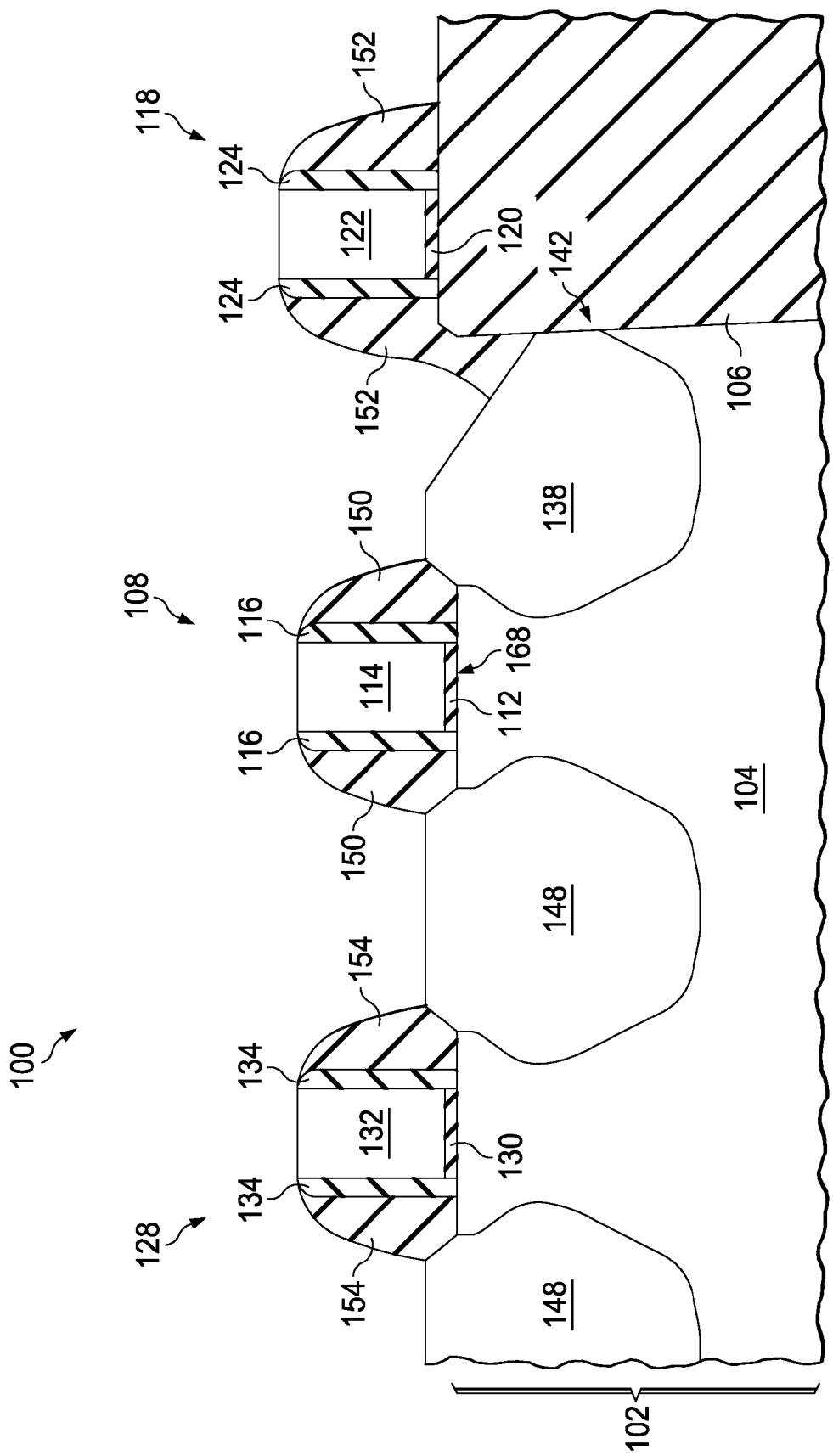

Referring to FIG. 2F, an anisotropic RIE process removes the conformal layer of dielectric spacer material 180 of FIG. 2E from over the gates 114, 122 and 132 to form the second dielectric spacers 150 on the first dielectric spacers 116 of the first gate structure 108, the second dielectric spacers 152 on the first dielectric spacers 124 of the second gate structure 118, and the second dielectric spacers 154 on the first dielectric spacers 134 of the third gate structure 128. Because of the thicker conformal layer of dielectric spacer material 180 over the top edge 140 of the first SiGe source/drain region 138 at the sidewall 142 of the field oxide 106, the second dielectric spacers 152 on the second gate structure 118 extend onto the angled surface facet of the first SiGe source/drain region 138. The desirable profile of the first SiGe source/drain region 138 at the sidewall 142 of the field oxide 106, resulting from forming the epitaxy hard mask 174 overlapping the semiconductor material 104 as described in reference to FIG. 2C, advantageously limits a lateral extent of the second dielectric spacers 152 on the angled surface facet of the first SiGe source/drain region 138, so that at least one third of the angled surface facet of the first SiGe source/drain region 138 is exposed.

Figure 2G:
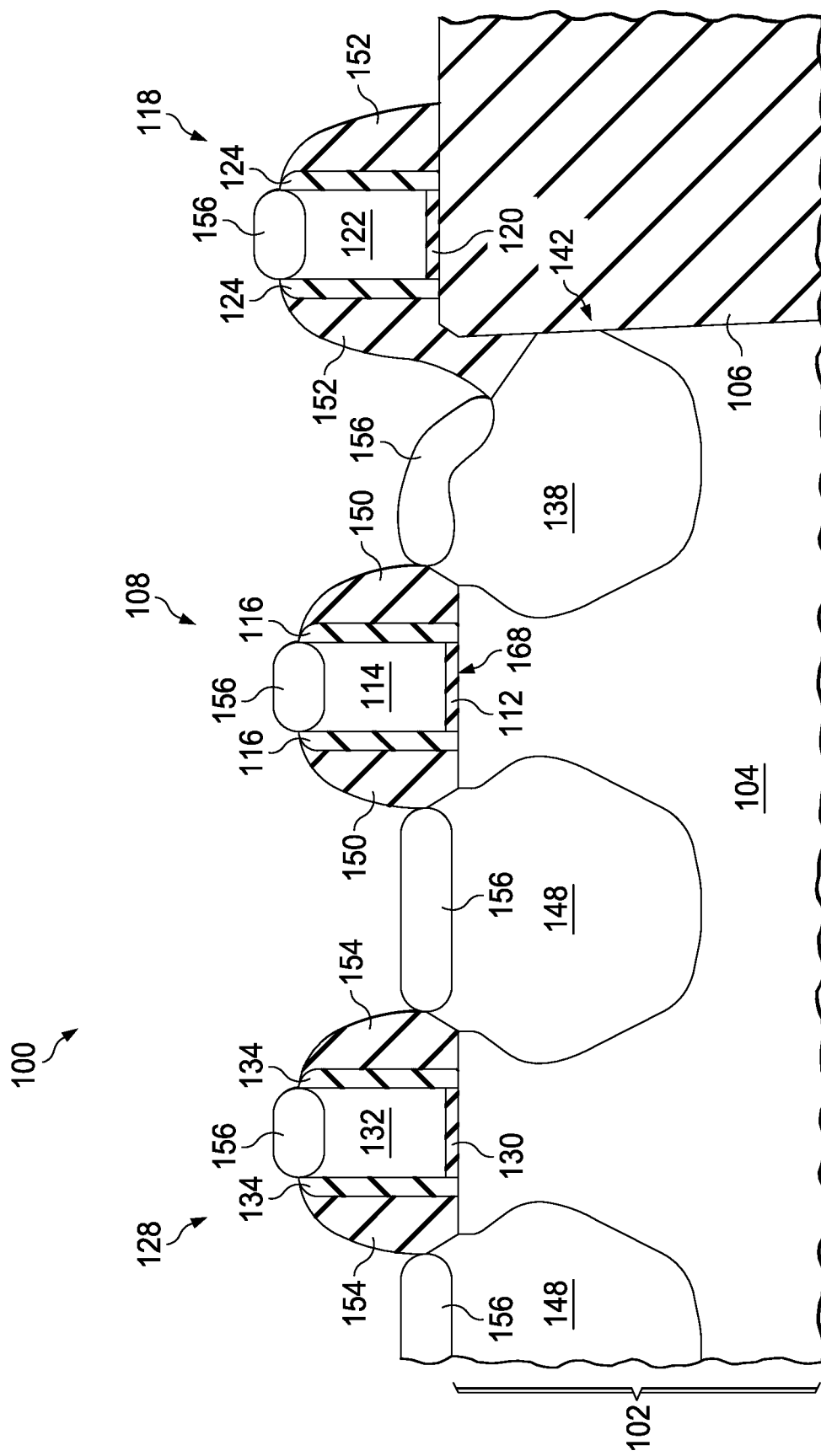

Referring to FIG. 2G, the metal silicide 156 is formed on the first SiGe source/drain region 138 and the additional SiGe source/drain regions 148 in areas which are exposed by the second dielectric spacers 150, 152 and 154, and possibly on the gates 114, 122 and 132. The metal silicide 156 may be formed, for example, by depositing a layer of metal, such as nickel, on an existing top surface of the integrated circuit 100, heating the integrated circuit 100 to react a portion of the metal with exposed SiGe and silicon, and selectively removing unreacted metal, by exposing the integrated circuit 100 to wet etchants including a mixture of sulfuric acid and hydrogen peroxide. Subsequently, the PMD layer 158 and contacts 160 and 162 of FIG. 1 are formed.

Figure 3A:
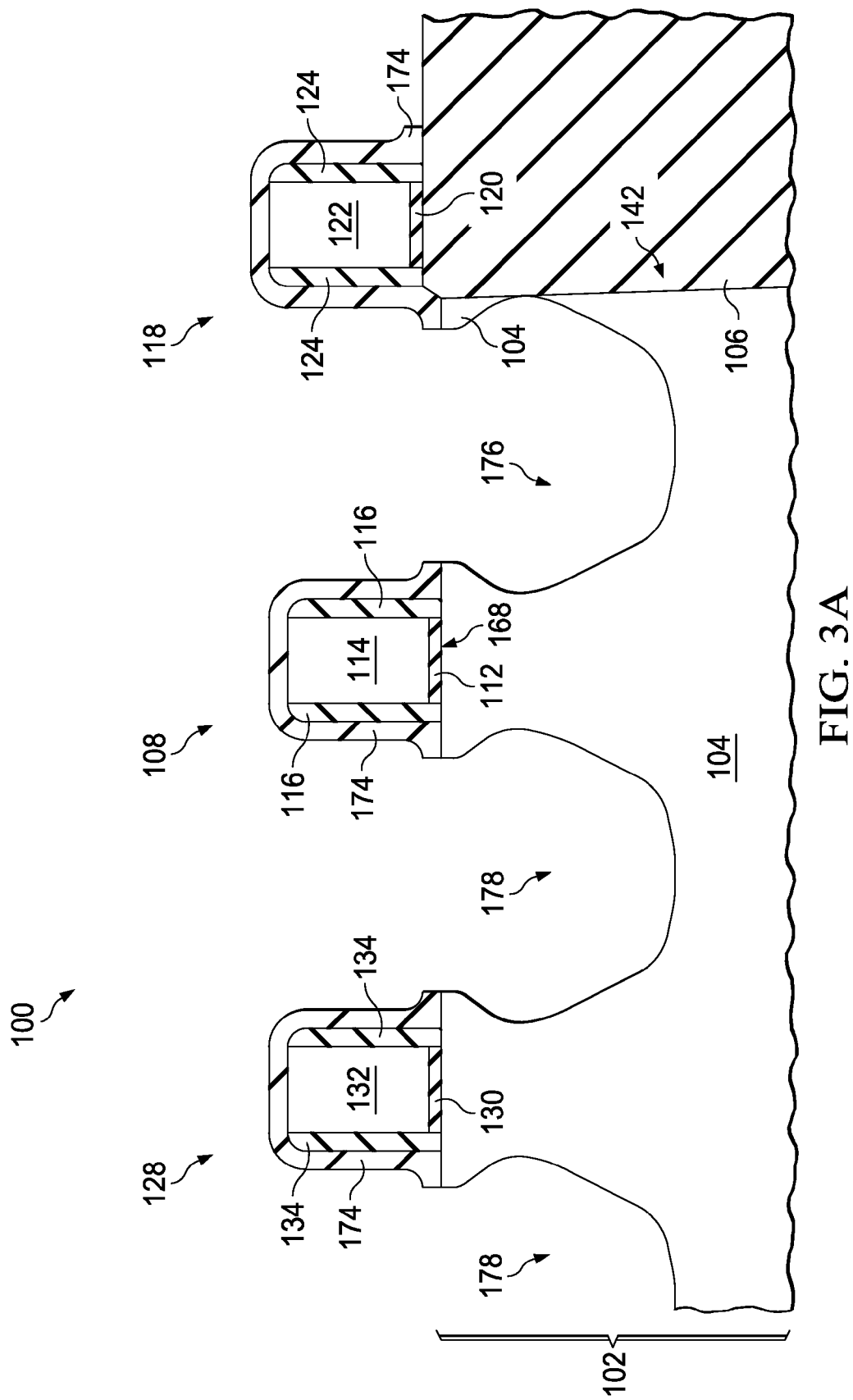
FIG. 3A through FIG. 3C are cross sections of an alternate version of integrated circuit of FIG. 1, depicted in successive stages of an alternate exemplary fabrication sequence.
Figure 3B:
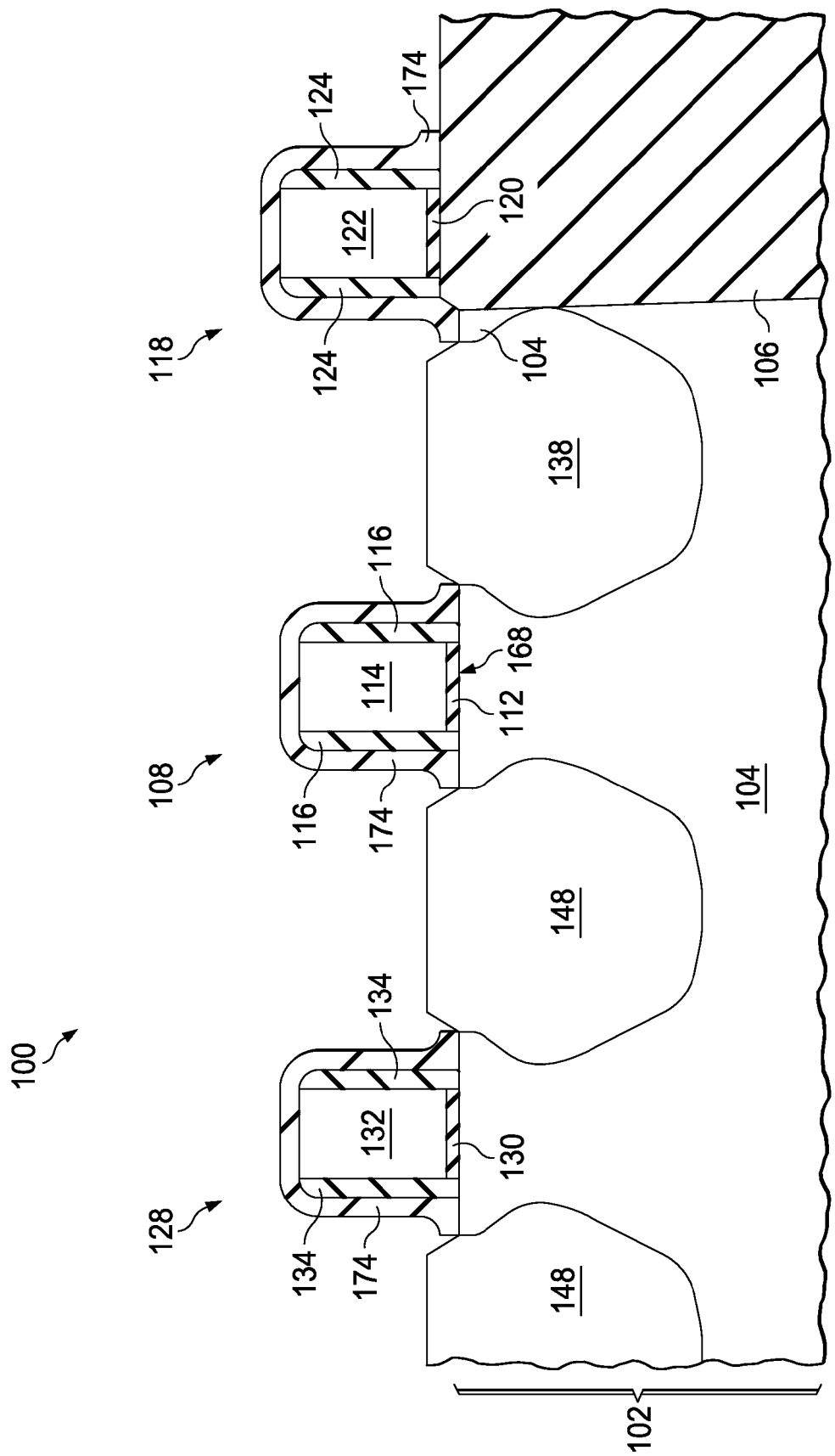
Figure 3C:
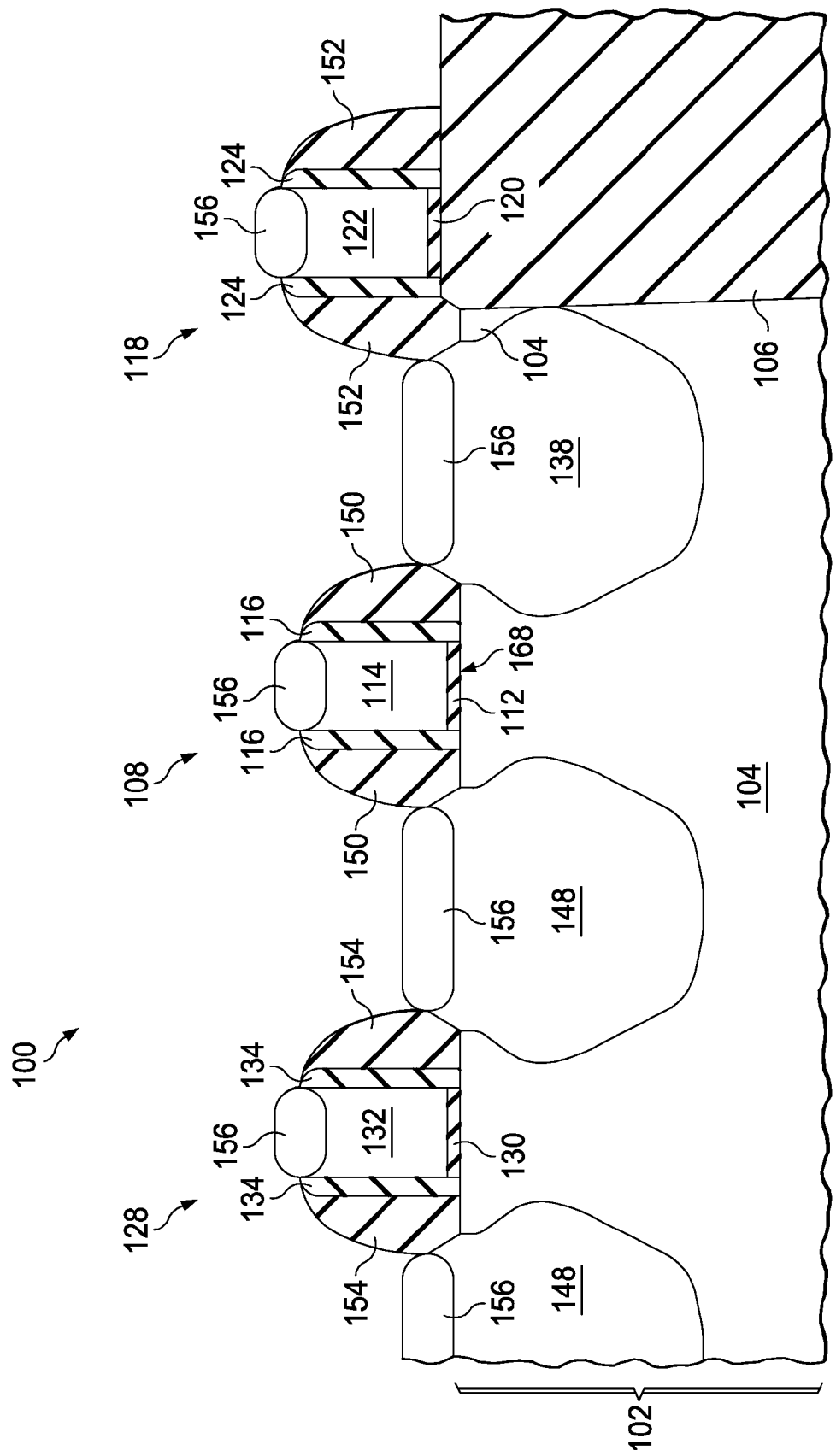

FIG. 3A through FIG. 3C are cross sections of an alternate version of integrated circuit of FIG. 1, depicted in successive stages of an alternate exemplary fabrication sequence. Referring to FIG. 3A, the epitaxy hard mask 174 over the second gate structure 118 overlaps the top surface 168 of the semiconductor material 104 between the first gate structure 108 and the second gate structure 118 sufficiently so that after the first source/drain cavity 176 is formed, the semiconductor material 104 remains on the sidewall 142 of the field oxide 106 immediately under the epitaxy hard mask 174.

Referring to FIG. 3B, the first SiGe source/drain region 138 is formed so that the top surface facet is substantially all above the top surface 168 of the semiconductor material 104. A profile of the first SiGe source/drain region 138 may be substantially similar to a profile of the additional SiGe source/drain regions 148, which may advantageously provide a stress in the semiconductor material 104 under the first gate structure 108 more nearly equal to a stress in the semiconductor material 104 under the third gate structure 128, compared to the configuration depicted in FIG. 1.

Referring to FIG. 3C, the metal silicide 156 on the first SiGe source/drain region 138 is substantially flat. A width of the metal silicide 156 on the first SiGe source/drain region 138 may be less than a width of the metal silicide 156 on the additional SiGe source/drain regions 148.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate comprising semiconductor material extending to a top surface of said substrate;
   field oxide disposed in said substrate;
   a first gate structure over said semiconductor material proximate to said field oxide, said first gate structure comprising:
      a gate dielectric layer over said semiconductor material; and
      a gate on said gate dielectric layer of said first gate structure;
   a second gate structure over said field oxide, said second gate structure comprising a gate on said gate dielectric layer of said second gate structure, such that said gate of said second gate structure does not overlap a sidewall of said field oxide facing the first gate structure;
   a silicon-germanium source/drain region in said substrate between said first gate structure and said second gate structure, such that a top edge of a boundary between said silicon-germanium source/drain region and said field oxide does not extend more than one third of a depth of said silicon-germanium source/drain region from a top surface of said semiconductor material;
   dielectric spacers adjacent to lateral surfaces of said gate of said second gate structure, extending onto said silicon-germanium source/drain region;
   metal silicide on said silicon-germanium source/drain region; and
   a contact between said first gate structure and said second gate structure, such that at least half of a bottom of said contact directly contacts said metal silicide on said silicon-germanium source/drain region.

2. The integrated circuit of claim 1, in which a lateral distance from a center of said first gate structure to a center of said second gate structure is a minimum distance for contacted gate structures according to design rules used to fabricate said integrated circuit.

3. The integrated circuit of claim 1, in which a lateral distance from a center of said first gate structure to a center of said second gate structure is less than 150 nanometers.

4. The integrated circuit of claim 1, in which said bottom of said contact is less than 40 nanometers wide.

5. The integrated circuit of claim 1, in which said metal silicide comprises nickel silicide.

6. The integrated circuit of claim 1, in which said depth of said silicon-germanium source/drain region is 50 nanometers to 80 nanometers.

7. The integrated circuit of claim 1, in which said metal silicide is substantially flat.

8. The integrated circuit of claim 1, in which a top surface of said field oxide is coplanar within 15 nanometers of said top surface of said semiconductor material under said first gate structure.

* * * * *